(12) United States Patent
Bae et al.

(10) Patent No.: US 6,541,822 B2
(45) Date of Patent: Apr. 1, 2003

(54) METHOD OF MANUFACTURING AN SOI TYPE SEMICONDUCTOR THAT CAN RESTRAIN FLOATING BODY EFFECT

(75) Inventors: Geum-Jong Bae, Kyunggi-do (KR); Nae-In Lee, Seoul (KR); Hee-Sung Kang, Kyunggi-do (KR); Yun-Hee Lee, Kyunggi-do (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 10/039,071

(22) Filed: Jan. 2, 2002

(65) Prior Publication Data

US 2002/0140033 A1 Oct. 3, 2002

(30) Foreign Application Priority Data

Mar. 30, 2001 (KR) ......................................... 2001-16833

(51) Int. Cl.$^7$ ............................................... H01L 21/20
(52) U.S. Cl. ......................... 257/347; 438/479; 438/450
(58) Field of Search ................................ 257/347, 351, 257/353; 438/234, 450; 437/36

(56) References Cited

U.S. PATENT DOCUMENTS

| | | | | |
|---|---|---|---|---|
| 4,980,306 A | * | 12/1990 | Shimbo | ........................ 437/34 |
| 6,121,659 A | * | 9/2000 | Christensen et al. | ........ 257/347 |
| 6,165,828 A | * | 12/2000 | Forbes et al. | ................ 438/234 |
| 6,194,289 B1 | * | 2/2001 | Lee | ............................ 438/450 |

* cited by examiner

Primary Examiner—David Nelms
Assistant Examiner—Thinh T. Nguyen
(74) Attorney, Agent, or Firm—Mills & Onello, LLP

(57) ABSTRACT

A method of forming a SOI type semiconductor device comprises forming a first trench in a SOI layer forming a portion of an isolation layer region between an element region and a ground region by etching the SOI layer of a SOI type substrate using an etch stop layer pattern as an etch mask, forming an impurity layer in or on a bottom surface of the first trench, forming a second trench exposing a buried oxide layer in the SOI layer in the remainder of the isolation layer region except the portion thereof between the element region and the ground region, and forming an isolation layer by depositing an insulation layer over the SOI substrate having the first and second trenches. The impurity layer can be formed by depositing a SiGe single crystal layer in the bottom surface of the first trench. Also, the impurity layer can be formed by implanting ions in the bottom surface of the first trench.

10 Claims, 9 Drawing Sheets

METHOD OF MANUFACTURING AN SOI TYPE SEMICONDUCTOR THAT CAN RESTRAIN FLOATING BODY EFFECT

This application relies for priority upon Korean Patent Application No. 2001-16833, filed on Mar. 30, 2001, the contents of which are herein incorporated by reference in their entirety.

FIELD OF THE INVENTION

The present invention relates to a semiconductor device and method for forming the same, and more particularly to a silicon-on-insulator (SOI) type semiconductor device and method forming the same, which can restrain a floating body effect (FBE) generated as elements formed on a SOI substrate are completely insulated from each other.

BACKGROUND OF THE INVENTION

To form a semiconductor device, a multitude of elements are formed on a surface layer of a silicon wafer and electrically connected with each other through lines. Accordingly, there is need for each element formed in the narrow region on the wafer to be electrically isolated from adjacent elements such that the elements are not influenced by each other. For this, in the semiconductor device, an isolation layer or impurity junction layer is commonly used.

However, as the degree to which semiconductor devices are integrated continues to increase and the magnitude, or size, of the various elements is minimized to reduce distance between the elements, it is difficult to exclude the influence between elements caused by interference by merely isolating the surface layer of the silicon layer by the conventional isolation layer. Also, the impurity junction layer by which semiconductor layers having impurity types different from each other are joined is not suitable for use in a semiconductor device adopting a high voltage element due to an inner pressure limit in joined surfaces. Particularly, the impurity junction layer is not suitable for use in a high radiation environment since current is generated from a depletion layer by radiation such as gamma ray radiation.

To solve the problems, a semiconductor device has been developed that uses an SOI substrate in which a buried oxide layer is formed below the elements. Particularly, in a high performance semiconductor device such as a central processing unit (CPU), the SOI type semiconductor device in which an element region is completely isolated by an insulation layer is widely used.

Referring to FIG. 1, an trench isolation layer 112 is formed on a SOI substrate to define element regions. A SOI layer in each element region forms a body 122 of a semiconductor element. The body 122 is in a floating state, which is electrically isolated by the isolation layer 112. This is an essential condition in the SOI substrate, but may raise various problems due to the floating body effect (FBE). For example, as shown in FIG. 1, when current flows in a channel region 120 of an n-type metal oxide silicon field effect transistor (NMOSFET), electrons collide with atoms forming the body 122 to generate pairs of holes and electrons. At this time, in a semiconductor device using a general bulk type substrate, the generated holes can be removed through a ground line connected to the substrate. However, in the semiconductor device using the SOI substrate, the generated holes are accumulated in a low electric potential region of the isolated body 122, i.e., below an interface between a source region 114 and a channel region 120. The accumulated holes, as shown in FIG. 2, operate to increase the electric potential of the channel and to decrease threshold voltage. Consequently, a change in drain voltage-current characteristic of the transistor such as a kink effect occurs.

Also, if the hole accumulation is intensified, the channel region 120 between the source/drain regions 114, 116 functions as a base of an n-type impurity doped bipolar transistor, and an n-type impurity region forming the source/drain region 114, 116 functions as an emitter and a collector thereof, so that an effective npn bipolar transistor is formed. This phenomenon is called a parasitic bipolar action (PBA). Once the PBA occurs, a breakdown voltage of the transistor is deteriorated and thereby the semiconductor device fails to function normally. Also, if the accumulated holes are combined with the electrons forming a portion of current for operating the transistor, a leakage current is generated, which only increases the malfunction of the circuit.

Accordingly, it is required that the semiconductor device adopting the SOI substrate uses a special ground method or means to remove holes accumulated in the body of each element region. As one approach of the special ground method, forming a contact that interconnects an extra ground line and a hole-accumulated region of the body below the interface between the source region and the channel region can be considered. However, since the body divided to define each element region has a shape integrated to suit to each element, a ground contact region 130, as shown in FIG. 3, which penetrates an isolation layer 112 and extends to a hole-accumulated region of a body in a channel region should be formed to form the contact for providing a ground. This ground contact region 130 is also formed below the source/drain region 114, 116 and the gate electrode 118. That is, to form the contact and the ground line, the integrated shape of the element regions should be changed. This change results in problems in that the integration degree of the device is lowered, the fabrication process is changed to incorporate the new structure, and the resulting parasitic capacitance is increased.

As another ground method, forming a ground region 230 separately from an element region 222 to provide a ground can be considered, as shown in FIG. 4 and FIG. 5. To provide a connector 220 between the element region 222 and the ground region 230, a thin trench isolation layer 212 is formed to have a bottom surface thereof spaced apart from the buried oxide layer 110. Thus, bodies 222 in the element and ground regions 230 are linked with each other through a SOI layer existing between the thin trench isolation layer 212 of an isolation layer 112 and the buried oxide layer 110, i.e., a connector 220, so that holes generated from the element region 222 can be moved to the ground region 230 through the connector 220. Holes moved to the ground region 230 are discharged to the outside through a contact plug 232 and a ground line 234. However, when the body linked structure as shown in FIG. 4 and FIG. 5 is used in the semiconductor device, the holes may not be smoothly discharged due to the resistance of the SOI layer forming the connector 220.

For example, to discharge the holes smoothly, it is desirable that the connector 220 forming a passage for transferring the holes between the bottom surface of the thin trench isolation layer 212 and the buried oxide layer 110 is heavily doped by a p-type impurity. However, in this case, if boron is used as the p-type impurity, the boron is easily diffused into a peripheral layer such as the buried oxide layer or the thin trench isolation layer. Consequently, the impurity concentration is lowered and thereby the holes are not smoothly discharged.

SUMMARY OF THE INVENTION

Therefore, it is an object of the present invention to provide an improved SOI type semiconductor device and method of forming the same, which, with high speed operation and precise element isolation, can prevent the malfunction of the semiconductor device from being generated due to a floating body effect.

It is another object of the present invention to provide an improved SOI type semiconductor device and method of forming the same which can effectively discharge holes accumulated in a body of a SOI layer in an element region of a NMOS transistor.

These and other objects can be achieved, according to an aspect of the present invention, by a SOI type semiconductor device comprising a SOI substrate having a lower silicon layer, a buried oxide layer, and a SOI layer which are sequentially stacked, an element region formed in a body of the SOI layer isolated by the buried oxide layer and an isolation layer, for forming source/drain regions of at least one MOSFET, a ground region formed of the body of the SOI layer isolated from the element region by a portion of the isolation layer, and a connector disposed in vicinity of the portion of the isolation layer isolating the ground region from the element region for connecting the element region with the ground region.

The ground region is preferably doped by a conductive impurity and the connector is formed of a conductive layer to connect the element region electrically with the ground region. The portion of said isolation layer is formed at a thickness so as to allow a bottom surface thereof to be spaced apart from said buried oxide layer. In the conductive layer, an impurity-contained silicon layer is disposed.

In a preferred embodiment, the impurity-contained silicon layer can be formed on side surfaces as well as the bottom surface of the isolation layer. Preferably, an impurity of the impurity-contained silicon layer can be germanium (Ge). Alternatively, an element such as an argon (Ar) which is electrically neutral can be used as an impurity.

In the embodiment, the impurity-contained silicon layer is formed of an epitaxial layer or an impurity-doped layer. Preferably, a thickness of the conductive layer, i.e., the connector disposed below the portion of the isolation layer is in the range of 50 to 500 Å when the epitaxial layer is used as the impurity-contained silicon layer and in the range of 300 to 1,000 Å when the impurity-doped layer is used.

The epitaxial layer is formed of a silicon germanium (SiGe) single crystal layer. Preferably, the SiGe single crystal layer has a Ge concentration of 10 to 40%. Also, the SiGe single crystal layer can contain a p-type impurity such as boron through an ion implantation or a source gas supply.

According to another aspect of the invention, there is provided a method of forming a SOI type semiconductor device comprising forming a first trench in a SOI layer forming a portion of an isolation layer region between an element region and a ground region by etching the SOI layer of a SOI substrate using an etch stop layer pattern as an etch mask, forming an impurity layer in or on a bottom surface of the first trench; forming a second trench exposing a buried oxide layer in the SOI layer in the rest of the isolation layer region except the portion thereof between the element region and the ground region while protecting the impurity layer, and forming an isolation layer by depositing an insulation layer over the SOI substrate having the first and second trenches.

In a preferred embodiment, the steps of forming the first and second trenches can be carried out by a general trench isolation method. The general trench isolation method comprises forming a silicon nitride layer on the SOI substrate, forming a trench mask pattern on the silicon nitride layer, and etching the SOI layer of the SOI substrate by using the trench mask pattern as a mask.

The step of forming an impurity layer can carried out by forming a SiGe single crystal layer in side walls and the bottom surface of the first trench. Alternatively, the SiGe single crystal layer can be formed only in the bottom surface of the first trench by forming spacers on the side walls of the first trench and using them as a mask. According to the conditions, a SiGe polycrystalline layer can be formed in the bottom surface of the first trench.

Also, the step of forming an impurity layer can carried out by implanting ions in the bottom surface of the first trench. Preferably, the implanted ions use an element such as Ge or Ar which is electrically inert with respect to Si and heavy enough to increase the impact amount during the ion implantation. A depth of the impurity layer to be formed can be controlled by increasing or decreasing the ion implantation energy. Accordingly, the impurity layer can be formed not to come in contact with the isolation layer.

The method of the invention further includes carrying out an ion implantation for forming an electrode to the SOI layer in the ground region by using an ion implantation mask after the step of forming the isolation layer, forming a gate electrode pattern on the SOI layer in the element region, and carrying out an ion implantation for forming source/drain regions to the SOI layer in the element region by using the gate electrode pattern as an ion implantation mask.

In the CMOS type semiconductor device, the first trench and/or the impurity layer for forming an electric connecting passage between the element and ground regions can be formed only between a NMOS transistor region and adjacent ground region since the hole accumulation problem due to the FBE is not serious in a PMOS transistor region.

BRIEF DESCRIPTION OF THE DRAWINGS

The foregoing and other objects, features and advantages of the invention will become more apparent from the following detailed description of preferred embodiments thereof made with reference to the attached drawings, of which.

DETAILED DESCRIPTION OF THE PREFERRED EMBODIMENTS

The present invention now will be described more fully hereinafter with reference to the accompanying drawings, in which preferred embodiments of the invention are shown. Like numbers refer to like elements throughout.

Embodiment 1

FIG. 6 through FIG. 12 are cross-sectional views illustrating the process steps of a method of forming a SOI type semiconductor device in accordance with a preferred first embodiment of the present invention.

Figure 1:
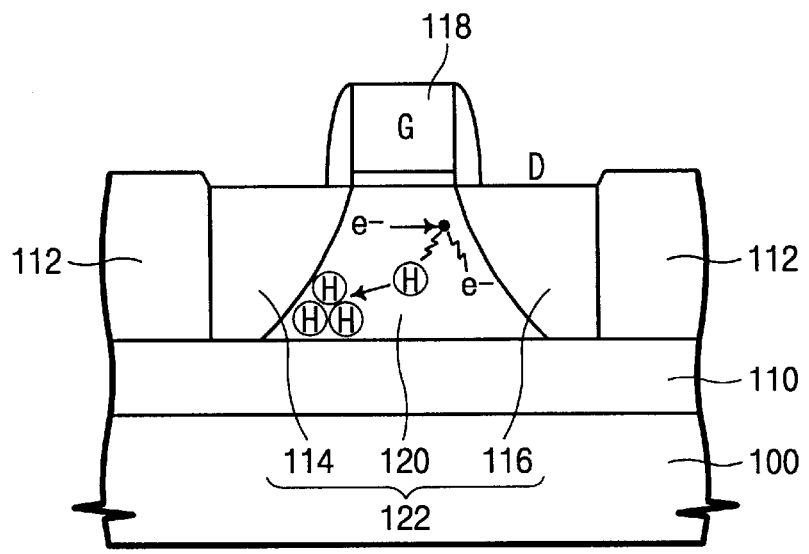
FIG. 1 is a cross-sectional diagram illustrating a FBE in a conventional SOI type semiconductor device.
Figure 2:
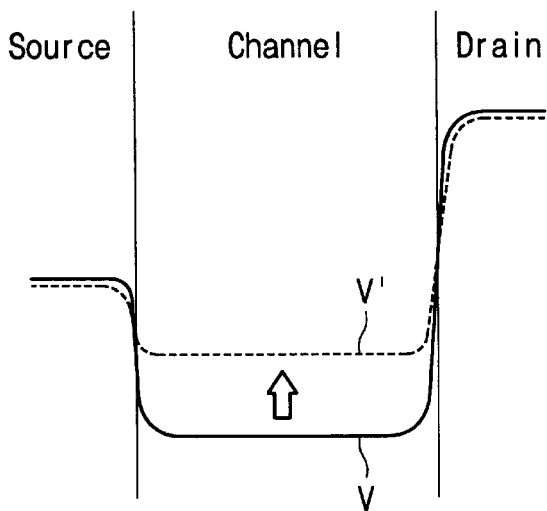
FIG. 2 is a diagram for illustrating a change in the channel potential according to the FBE in the conventional semiconductor device.
Figure 3:
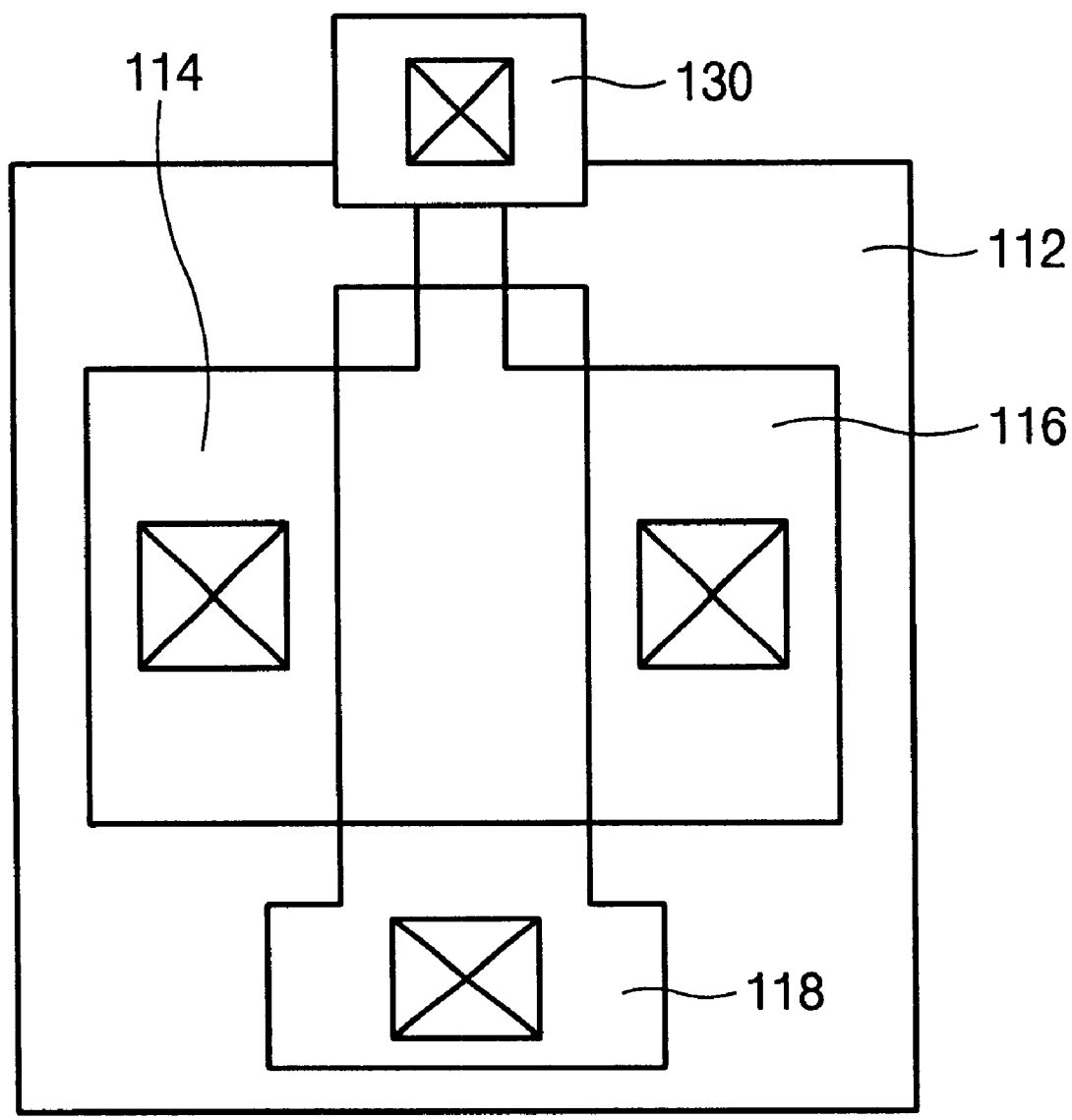
FIG. 3 is a top plan view for illustrating one example of the conventional SOI type semiconductor device for preventing the FBE.
Figure 4:
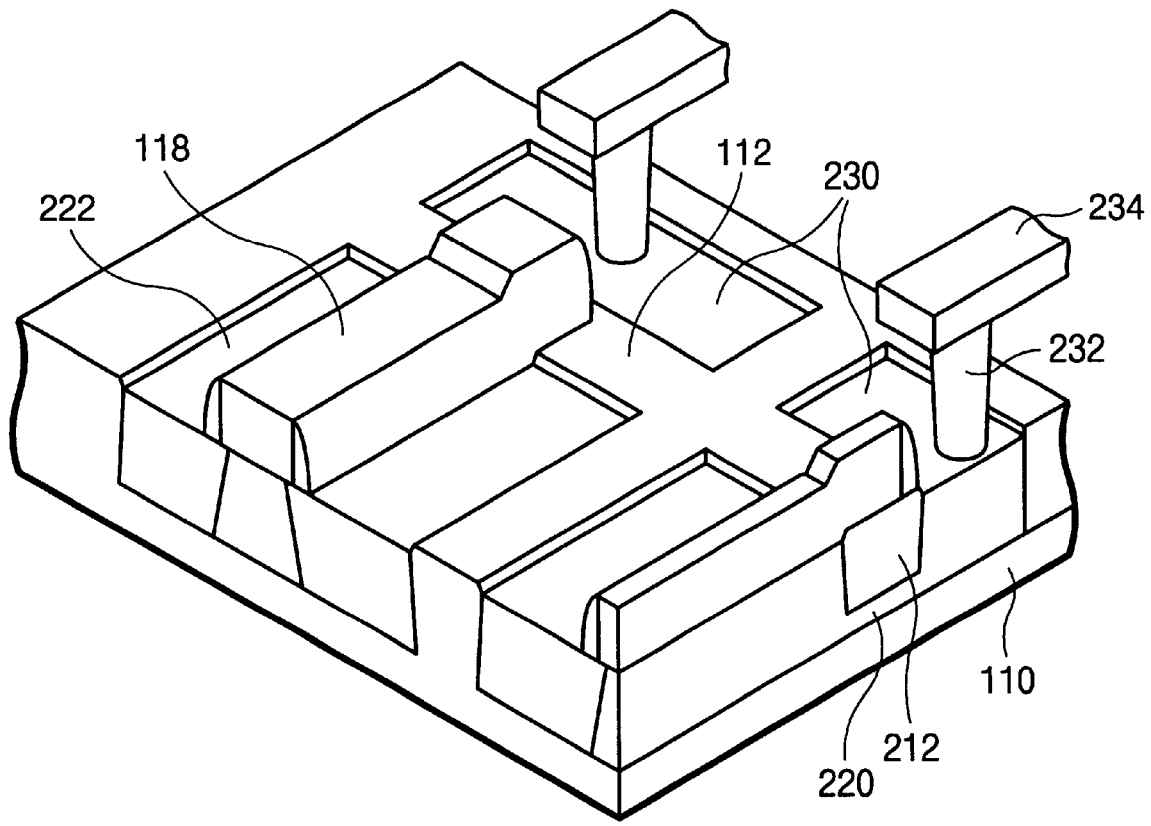
FIG. 4 and FIG. 5 are partial perspective and cross sectional views respectively for illustrating another example of the conventional SOI type semiconductor device for preventing the FBE.
Figure 5:
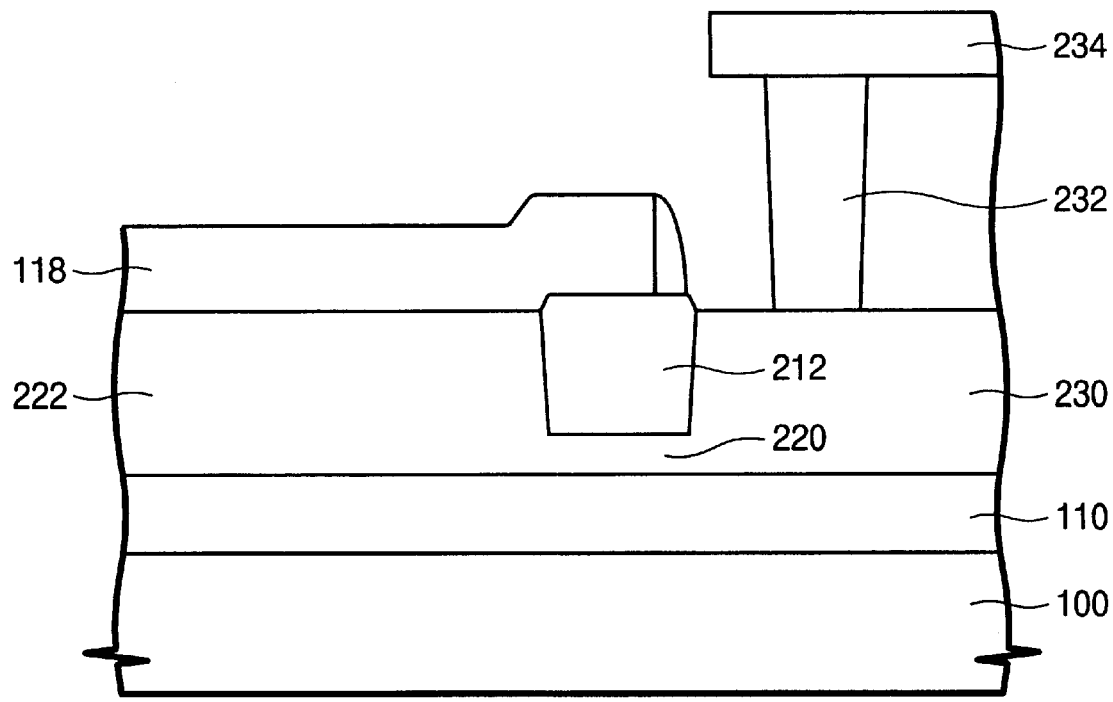
Figure 6:
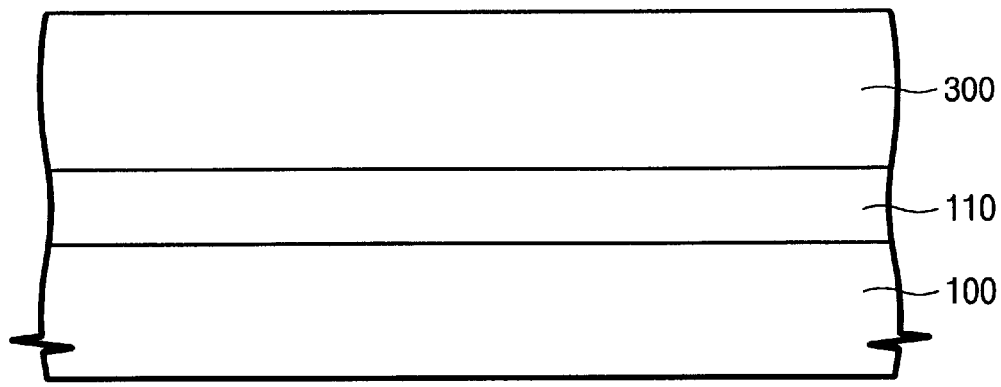
FIG. 6 through FIG. 12 are cross-sectional views for illustrating the process steps of a method of forming a SOI type semiconductor device in accordance with a preferred embodiment of the present invention.

Referring now to FIG. 6, a SOI substrate having a structure in which a lower silicon layer 100, a buried oxide layer 110, and a SOI layer 300 are sequentially stacked is formed. The SOI substrate can be formed by a method of preparing two bulk silicon substrates, forming an oxide layer on a surface of one of the two bulk silicon substrates, and joining the surfaces of two substrate thermally, or a method of oxidizing surfaces of two bulk silicon substrates and joining the oxidized surfaces of the bulk silicon substrates thermally. At this time, a large portion of one of the two bulk silicon substrates are removed to form a SOI layer, for example via a chemical-mechanical polishing (CMP) method.

Figure 7:
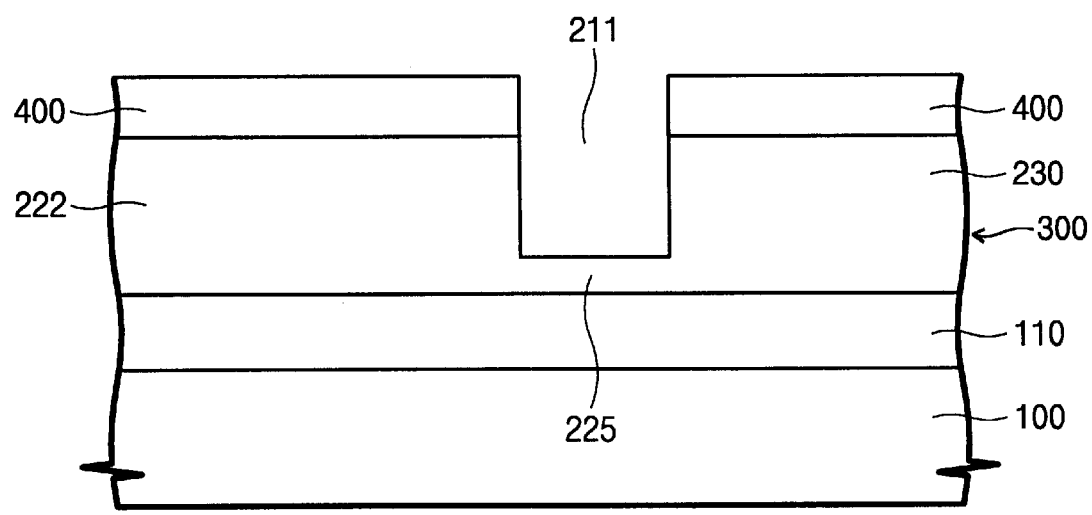

Referring to FIG. 7, to form a shallow trench isolation layer (212 of FIG 10) of an isolation layer region (200 of FIG 10) defining an element region 222 and a ground region 230 in the SOI layer 300, an etch stop layer 400 is formed of a silicon nitride layer on the SOI layer 300. The etch stop layer 400 exposes the SOI layer 300 in the portion of an isolation layer region in which the shallow trench isolation layer 212 and a connector (220' of FIG. 8) are to be formed between the element region 222 and the ground region 230. The SOI layer 300 is then etched to form a shallow trench 211 by using the etch stop layer 400 as an etch mask. At this time, the SOI layer 300 is etched until a thickness of a portion 225 thereof remaining below the shallow trench 211 is in the range of 200 to 500 Å. Accordingly, the buried oxide layer 110 disposed below the shallow trench 211 is not exposed.

More specially, in a general method of forming a trench, a pad oxide layer is formed on the SOI substrate. On the pad oxide layer, a silicon nitride layer is stacked as an etch stop layer. A photo-resist is then formed on the silicon nitride layer. Next, the photo-exposure and development process is carried out to the photo-resist to form a photo-resist pattern. Thereafter, the silicon nitride layer and the pad oxide layer are sequentially etched to form an etch mask pattern by using the photo-resist pattern as a mask. After removing the photo-resist pattern, the SOI layer of the SOI substrate is etched by using the etch mask pattern as a mask. According to the degree of etching, a shallow trench, or a deep trench exposing the buried oxide layer can be formed.

Figure 8:
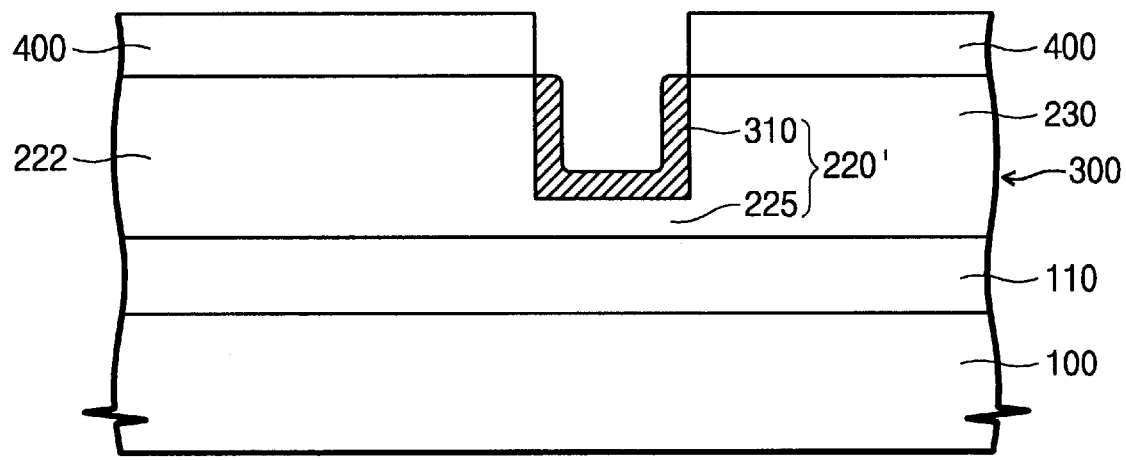

Referring to FIG. 8, a process for curing crystal defects generated as a result of etch damage in an inner wall of the shallow trench 211 is carried out to the SOI substrate in which the shallow trench 211 is formed. The curing process can be carried out at an oxidative atmosphere or a non-oxidative atmosphere. If surface oxides are formed by curing at the oxidative atmosphere, they are removed by a wet etching. Then, an SiGe epitaxial layer 310 is formed in an inner wall surface and a bottom surface of the shallow trench 211. Preferably, the SiGe epitaxial layer 310 is formed of a layer having a Ge concentration of 10 to 40%. The SiGe epitaxial layer 310 is usually formed by supplying a mixed gas including a source gas such as a silane ($SiH_4$) and a germane ($GeH_4$) and a HCl gas at a temperature of 700 to 900° C. and a low pressure of several to several tens of Torr. If the process pressure is lowered, the process temperature can also be lowered. The HCl gas functions to prevent a SiGe polycrystalline layer from being formed on a surface of the etch stop layer 400.

Figure 9:
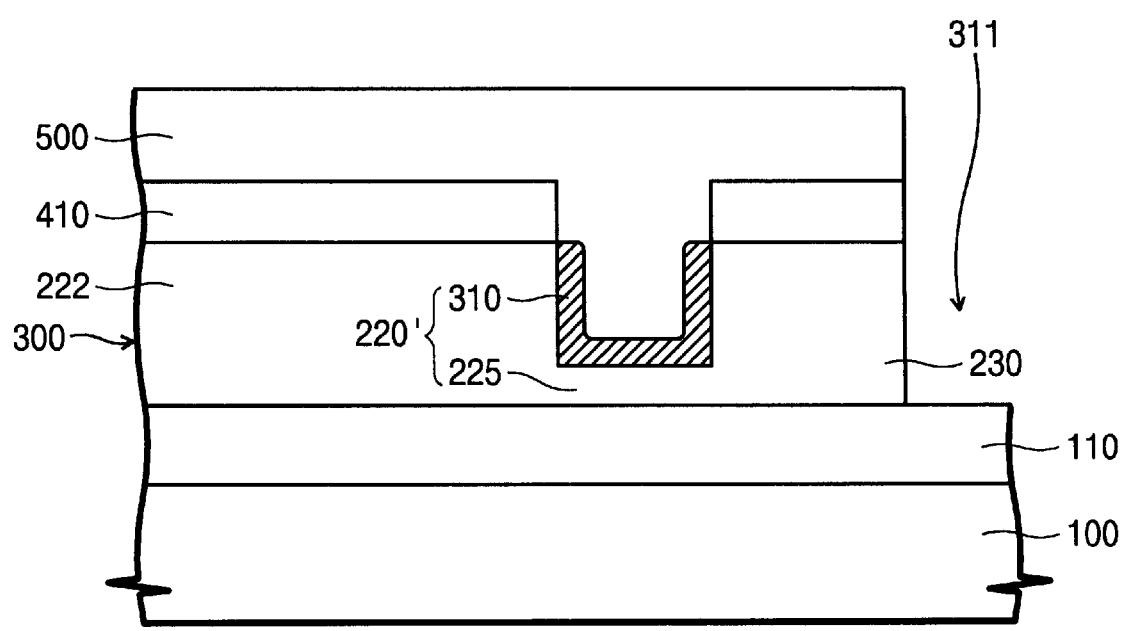

Referring to FIG. 9, a photo-resist pattern 500 is formed over the SOI substrate on which the SiGe epitaxial layer 310 is formed. The photo-resist pattern 500 exposes the etch stop layer 400 in the rest of the isolation layer region except the portion thereof in which the shallow trench isolation layer 212 of the isolation layer region 200 is to be disposed. The photo-resist pattern 500 is formed by forming a photo-resist and performing a photo-exposure and development process to the photo-resist. The etch stop layer 400 for forming the shallow trench 211 is then etched to form an etch mask pattern 410 by using the photo-resist pattern 500 as an etch mask. And then, the SOI layer 300 is etched to form a deep trench 311 exposing the buried oxide layer 110 by using the photoresist pattern 500 and the etch mask pattern 410 as an etch mask. At this time, the shallow trench 211 in which the SiGe epitaxial layer 310 is formed is protected by the photo-resist pattern 500.

Figure 10:
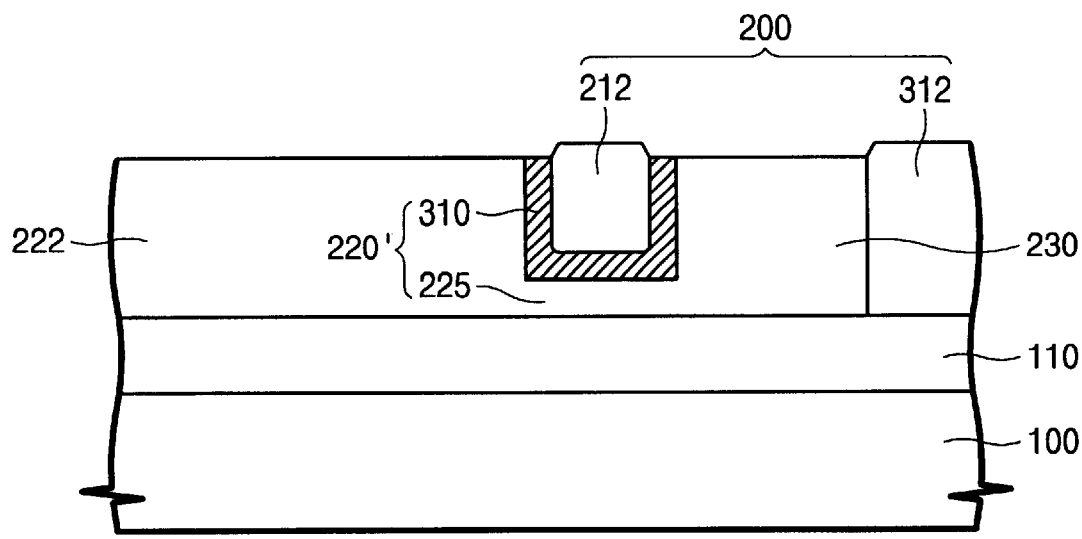

Referring to FIG. 9 and FIG. 10, the photo-resist pattern 500 is removed and a process for curing an etch damage in an inner wall of the deep trench 311 is carried out. A chemical vapor deposition (CVD) oxide layer is then formed over the SOI substrate to fill the shallow and deep trenches 211, 311. Alternatively, before forming the CVD oxide layer, a conformal silicon nitride liner can be formed over the SOI substrate. The CVD oxide layer formed on the etch mask pattern 410 is removed through the CMP. The exposed etch mask pattern 410 is also removed through a wet etchant such as a phosphoric acid. Consequently, a shallow trench isolation layer 212 and a deep trench isolation layer 312 forming the isolation layer region 200 are obtained.

Here, it should be noted that in the embodiment of the present invention, filling the shallow and deep trenches 211, 311 with the CVD oxide layer to form the shallow and deep trench isolation layer 212, 312, respectively, are described as being concurrently carried out, but these steps can be separately carried out. That is, the shallow trench isolation layer 212 can be formed after forming the deep trench isolation layer 312, or contrary the deep trench isolation layer 212 can be first formed.

Figure 11:
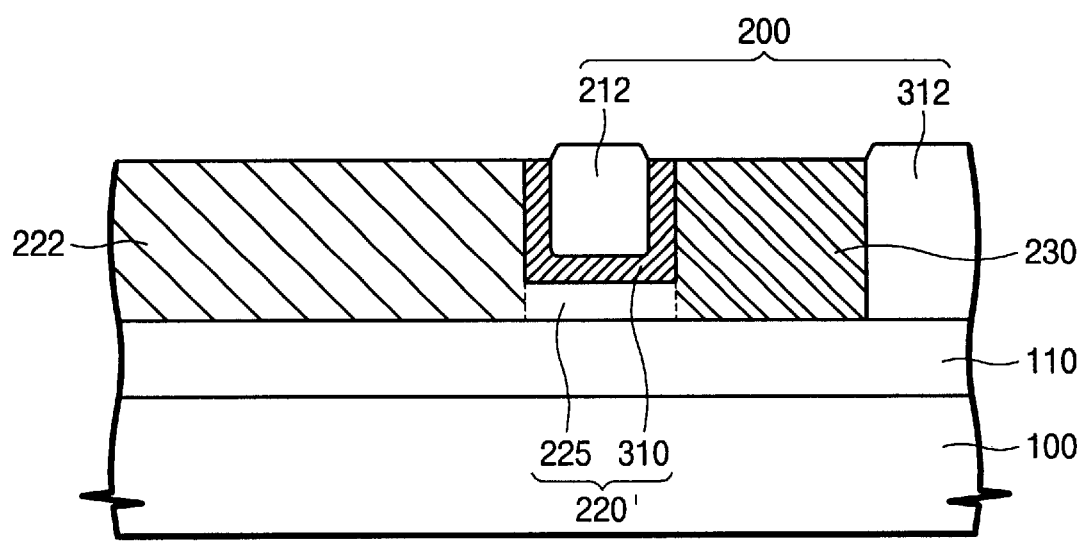

Referring to FIG. 11, the ground region 230 is implanted by a p-type impurity such as boron to enhance the conductivity. The ion implantation is selectively carried out by using a photo-resist pattern as an ion implantation mask. Also, channel ion implantation for forming a channel in the element region 222 is carried out by using a different photo-resist pattern as an ion implantation mask. If the embodiment of the invention is applied to a CMOS semiconductor device, the channel ion implantation is carried out one time for each of NMOS and PMOS transistor regions. In this case, the p-type ion implantation for the ground region 230 can be carried out with the channel ion implantation for the NMOS transistor region. Generally, the ground region 230 is heavily doped by a dose of $1.0 \times 10^{14}$ to $1.0 \times 10^{16}$ ions/cm$^2$, and the channel in the element region 222 is lightly doped by a dose of $1.0 \times 10^{12}$ ions/cm$^2$.

Figure 12:
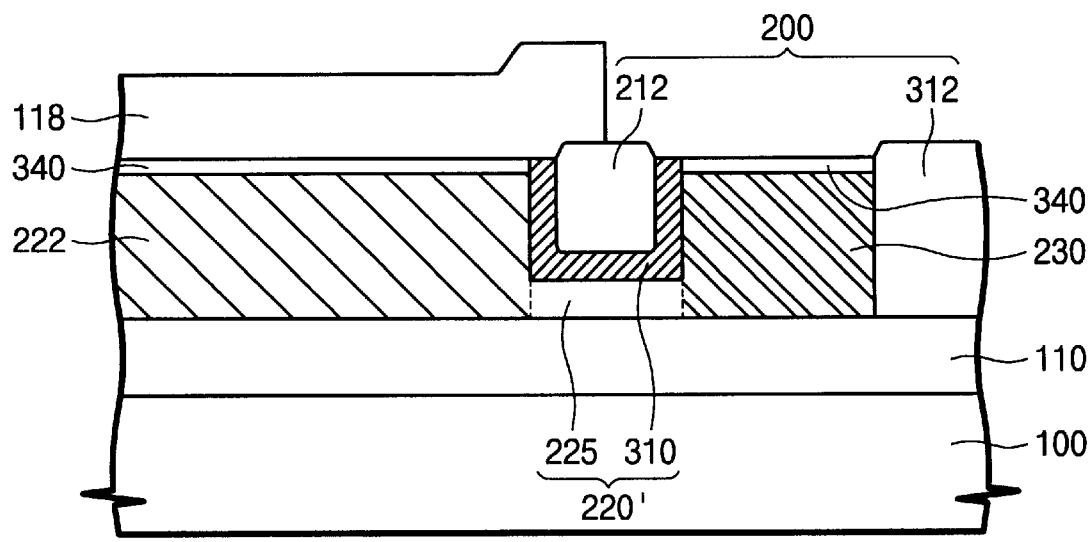

Referring to FIG. 12, a gate insulation layer 340 is formed through a thermal oxidation on the surface of the SOI layer 300 in each of the element and ground regions 222, 230 which are divided by the isolation layer region 200. On the gate insulation layer 340, a gate layer is formed and patterned to form a gate electrode 118. Then, the following processes, such as an n-type ion implantation for forming source/drain regions of a NMOS transistor, are carried out.

The gate layer can be formed of a single conductivity layer, or a multi-layered layer having a polysilicon layer and a metal silicide layer.

Generally, in the CMOS semiconductor device, patterning the gate layer to form the gate electrode is concurrently carried out in the NMOS and PMOS transistor regions. However, the ion implantation for forming the source/drain regions is preferably separately carried out to each of the NMOS and PMOS transistor regions. The ion implantation for the ground region 230 explained with reference to FIG. 11, according to the needs, can be carried out together when the PMOS transistor region is heavily doped to form the source/drains after forming the gate electrode. The ion implantation for forming the source/drain regions is preferably carried out at a dose of $1.0 \times 10^{14}$ to $1.0 \times 10^{16}$ ions/cm$^2$.

Also, supposing that spacers are formed on side walls of the gate electrode, the source/drain regions in the NMOS and PMOS transistor regions are generally formed to have a dual doped structure. The dual doped structure is formed by doping pre-source/drain regions lightly by a dose of $1.0 \times 10^{12}$ ions/cm$^2$ after forming the gate electrode, forming a conformal oxide layer on the gate electrode, etching the substrate having the conformal oxide layer anisotropically to form the spacers on the side walls of the gate electrode, and doping the pre-source/drain regions heavily by using the gate electrode and the spacers as an implantation mask.

Embodiment 2

Figure 13:
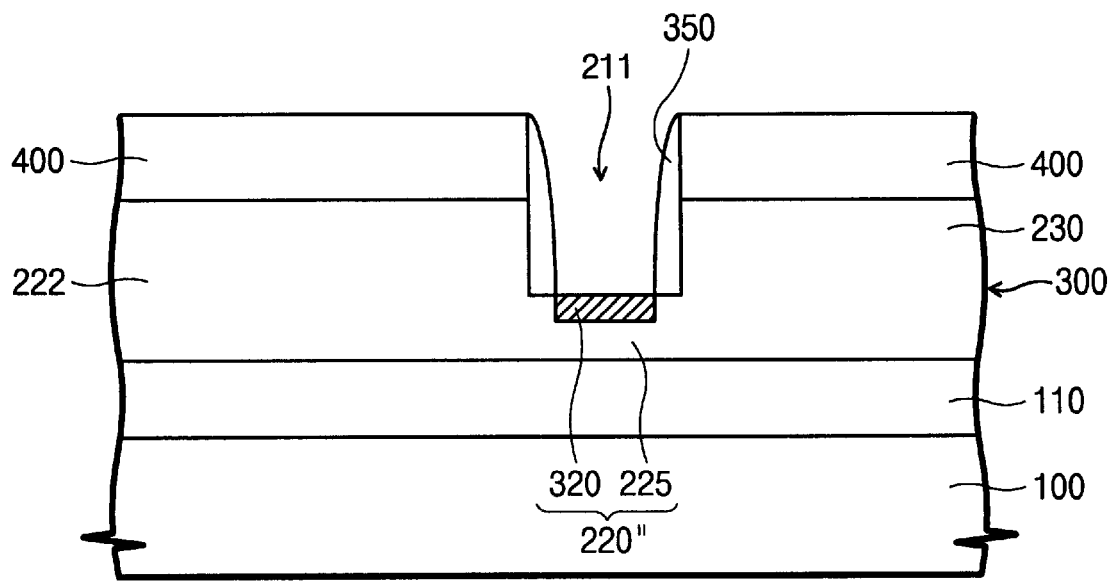
FIG. 13 to FIG. 15 are cross-sectional views for illustrating methods of forming a SOI type semiconductor device in accordance with other preferred embodiments of the present invention.

FIG. 13 is a cross-sectional view for illustrating a method of forming a SOI type semiconductor device in accordance with a preferred second embodiment of the present invention.

Referring to FIG. 13, a silicon oxide layer is formed of a thickness of several hundred A through the CVD method over the whole surface of a SOI substrate in which a shallow trench 211 is formed as shown in FIG. 7. The SOI substrate having the silicon oxide layer is then anisotropically etched. Consequently, oxide spacers 350 are formed on side walls of the shallow trench 211. At this time, the SOI substrate is preferably over-etched until a portion 225 of a SOI layer 300 disposed below a bottom of the shallow trench 211 is hollowed out to a given depth. A process for curing crystal defects due to the etch damage in an inner side wall of the shallow trench 211 is then carried out. Next, a SiGe epitaxail layer 320 is formed in a hollow which is formed on the portion 255 of the SOI layer 300 disposed below the bottom of the shallow trench 211 during the anisotropic etching. On the other place except the hollow, the SiGe epitaxail layer 320 is not grown since there is covered with an etch stop layer 400 and the spacers 350. The SiGE epitaxial layer 320 is formed by supplying a mixed gas including a source gas such as silane (SiH$_4$), germane (GeH$_4$) and HCl gas at a temperature of 700 to 900° C. and a low pressure of several to several ten Torr, as explained with reference to the first embodiment of the invention.

The following processes can be carried out similar to the method described with reference to the first embodiment. In the resultant semiconductor device formed as described above, the portion 225 of the SOI layer 300 and the SiGe epitaxial layer 320 having a low resistance formed only below the shallow trench isolation layer forms the connector 220" providing an electric connecting passage between the element region 222 and the ground region 230. Thus, the semiconductor device of the second embodiment has an improved effect in discharging holes generated in the element region 222.

Embodiment 3

Figure 14:
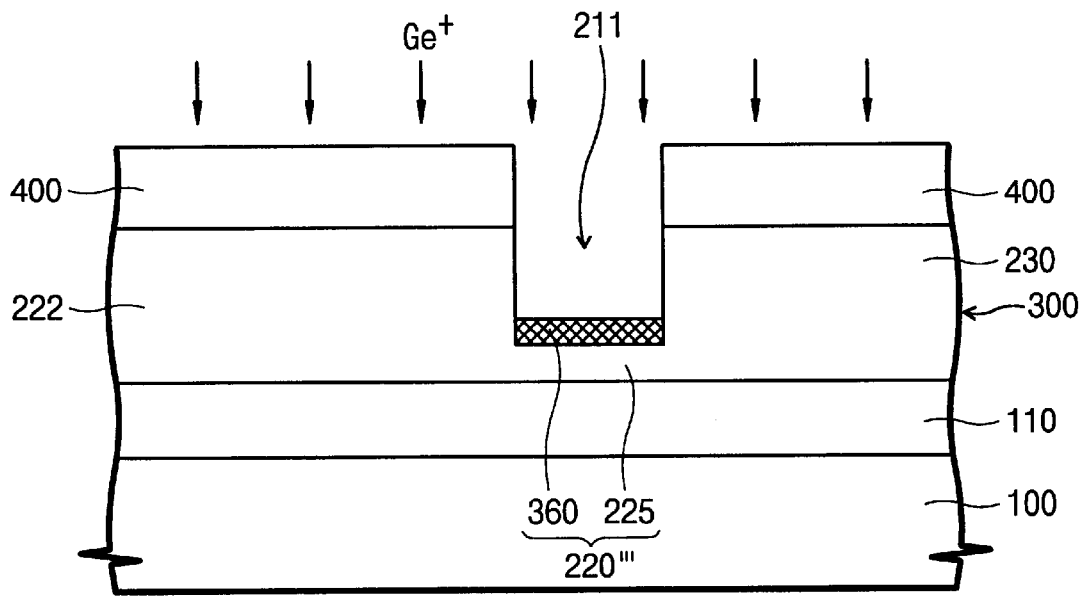

FIG. 14 is a cross-sectional view for illustrating a method of forming a SOI type semiconductor device in accordance with a preferred third embodiment of the present invention.

Referring to FIG. 14, a shallow trench 211 is formed in a SOI substrate as shown in FIG. 7. At this time, a portion 225 of a SOI layer 300 remained below the shallow trench 211 has a thickness of 300 to 1,000 Å. In this state, the portion 225 of the SOI layer 300 is implanted with Ge to form a SiGe layer 360. At this time, the ion implantation is carried out at a dose having a concentration higher than a dose of $1.0 \times 10^{14}$ to $1.0 \times 10^{16}$ ions/cm$^2$ for forming general source/drain regions. A depth of the SiGe layer 360 to be formed can be controlled by increasing or decreasing the ion implantation energy. Accordingly, the SiGe layer 360 can be formed in the SOI layer 300 so as to not come in contact with the buried oxide layer 110. Also, an etch stop layer 400 such as a silicon nitride layer formed on the rest of the SOI layer 300 except the portion thereof in an isolation layer region between an element region 222 and a ground region 230 functions as an ion implantation mask. Consequently, the SiGe layer 360 is formed only on an exposed bottom of the shallow trench 211. Alternatively, boron can be implanted together with the Ge. After the ion implantation, a process for curing the etch damage and ion implantation damage in an inner wall of the shallow trench 211 is carried out. Thus, the SiGe layer 360 is formed only in the exposed bottom of the shallow trench 211, i.e., in the portion 225 of the SOI layer 300 between the element region 222 and the ground region 230. The remaining processes are carried out in a manner similar to the first and second embodiments.

Since the SiGe layer 360 has the property of absorbing the boron atoms, an impurity concentration in the portion 225 of the SOI layer 300 forming a connector 220''' together with the SiGe layer 360 is increased during the following ion implantation. Also, a plurality of carriers in the SiGe layer 360 containing the boron becomes to holes, so that the resistance of the portion 225 of the SOI layer 300 forming a connecting passage between the element region and the ground region can be reduced and thereby the holes generated in the element region can be easily discharged.

Embodiment 4

Figure 15:
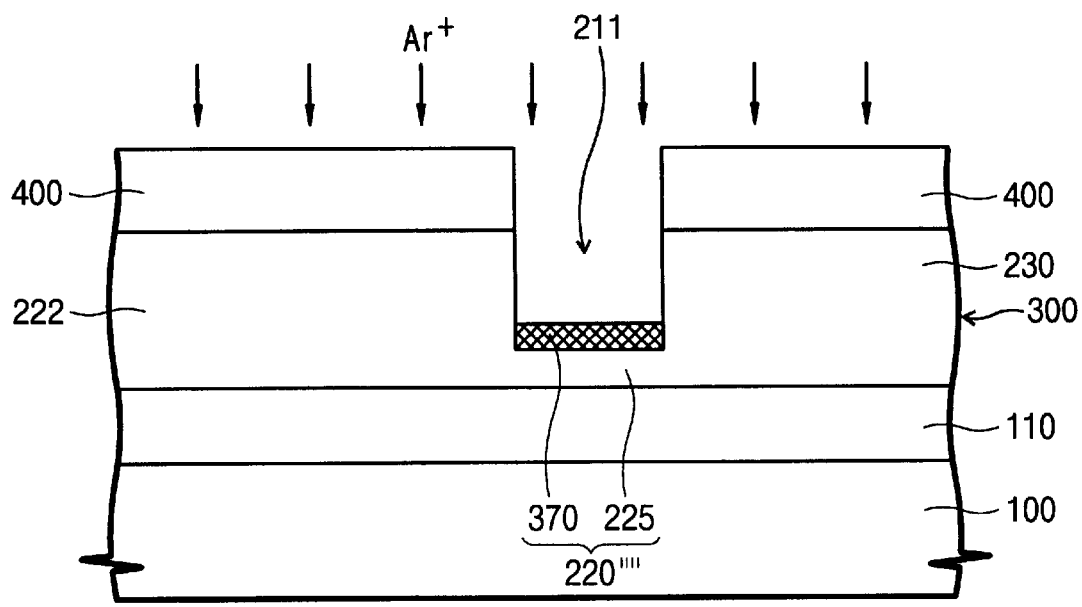

FIG. 15 is a cross-sectional view for illustrating a method of forming a SOI type semiconductor device in accordance with a preferred forth embodiment of the present invention.

Referring to FIG. 15, a process for curing crystal damages of an inner walls of a shallow trench 211 is carried out to a SOI substrate on which the shallow trench 211 is formed as shown in FIG 7. The SOI substrate is then implanted by an argon (Ar) to form a Ar-contained silicon layer 370. In the ion implantation, a dose is $1.0 \times 10^{14}$ to $1.0 \times 10^{16}$ ions/cm$^2$ and an ion implantation energy is 60 to 100 KeV. The depth of the Ar-contained silicon layer 370 to be formed can be controlled by increasing or decreasing the ion implantation energy. Accordingly, the Ar-contained silicon layer 370 can be formed in the SOI layer 300 so as not to come in contact with the buried oxide layer 110. At this time, an etch stop layer 400 such as a silicon nitride layer formed on the rest of the SOI layer 300 except the portion thereof between an element region 222 and a ground region 230 functions as an ion implantation mask. Consequently, the Ar-contained silicon layer 370 is formed only in an exposed bottom of the shallow trench 211, i.e., in a portion 225 of the SOI layer 300. The Ar-contained silicon layer 370 forms a connector 220"" together with the portion 225 of the SOI layer 300.

The remaining processes can be carried out in a manner similar to the first and second embodiments.

In this embodiment, it is difficult for the Ar-contained silicon layer 370 to have the effect of reducing the hole floating resistance as that in the SiGe layer 360 containing Ge, since it does not have an improved capability in absorbing a p-type impurity such as a boron in the following ion implantation. However, when crystal damage is generated as a result of the ion implantation, portions having the crystal damage operate as a recombination center or hole trap to allow holes accumulated in a body of the SOI layer 300 in the element region to be easily removed. Thus, the Ar-contained silicon layer 370 can prevent the NMOS transistor formed in the element region from raising the malfunction due to the accumulated holes.

The operation or process under which the holes are generated and removed in the SOI type semiconductor device formed is now described in accordance with the embodiments of the present invention. First, as the elements are operated, a current in which electrons act as a carrier flows in a channel of a NMOS transistor and thereby pairs of holes and electrons are generated by the collision between the electrons and atoms of a body of the SOI layer 300 in the element region 222. The electrons forming the channel current are moved into a drain region, and the holes are accumulated into a low electric potential region below an interface between a source region and the channel. When the holes are accumulated to some extent, they are moved to the ground region 230 in which hole density is low and thereby electric potential is low. At this time, the holes pass through the connector 220', 220" or 220'" of the SOI layer 300 disposed below the shallow trench isolation layer 212. Since the connector 220', 220" or 220'" includes a SiGe layer having a high boron concentration, it has a low hole floating resistance to allow the holes to be easily moved. At this time, if a ground terminal is supplied with a little negative voltage, the holes can be more easily discharged.

In the case of the connector 220'" in which the Ar-contained silicon layer 370 is formed in the portion 225 of the SOI layer 300 disposed below the shallow trench isolation layer 212 through ion implantation, portions in which crystal damage is generated due to the ion implantation operate as a recombination center or hole trap in which the electrons transmitted from the source region are combined with the holes accumulated in the element region to be changed into neutral atoms. Consequently, a portion of the holes generated in the element region is discharged to the ground region and the other portion thereof is combined with the electrons at the portions having the crystal damage, so that a problem such as hole accumulation can be prevented.

As apparent from the foregoing description, it can be appreciated that the SOI type semiconductor device of the present invention can effectively prevent the hole accumulation due to the floating body effect, and the malfunction and characteristic degradation of the semiconductor device according to the hole accumulation, without largely changing the composition thereof, as compared with a conventional SOI type semiconductor device.

In the drawings and specification, there have been disclosed typical preferred embodiments of the invention and, although specific terms are employed, they are used in a generic and descriptive sense only and not for purpose of limitation, the scope of the invention being set forth in the following claims.

What is claimed is:

1. A method of forming a SOI type semiconductor device comprising the steps of:

forming a SOI substrate having a lower silicon layer, a buried oxide layer, and a SOI layer;

forming a first trench in said SOI layer forming a portion of an isolation layer region between an element region and a ground region by etching said SOI layer using an etch stop layer pattern as an etch mask;

forming an impurity layer at a bottom surface of said first trench;

forming a second trench exposing said buried oxide layer in said SOI layer in a portion of said isolation layer region except the portion thereof between said element region and said ground region while protecting said impurity layer; and forming an isolation layer by depositing an insulation layer over said SOI substrate having said first and second trenches.

2. The method according to claim 1, wherein said step of forming a first trench comprises etching said SOI layer to remain at a given thickness below said first trench; and wherein said step of forming an impurity layer comprises growing a SiGe single crystal by supplying a source gas including Si and Ge.

3. The method according to claim 2, wherein said step of forming an impurity layer further includes forming spacers on side walls of said first trench before carrying out said step of growing a SiGe single crystal.

4. The method according to claim 3, wherein said step of forming spacers comprises:

forming a spacer insulation layer at a thickness less than a half of a width of said first trench; and anisotropically etching said SOI substrate on which said spacer insulation layer is formed, until said SOI layer remaining below said first trench is etched to a given thickness.

5. The method according to claim 1, wherein said step of forming a first trench comprises etching said SOI layer to remain at a given thickness below said first trench; and wherein said step of forming an impurity layer comprises implanting Ge into said remaining SOI layer.

6. The method according to claim 1, wherein said step of forming a first trench comprises etching said SOI layer to remain at a given thickness below said first trench; and wherein said step of forming an impurity layer comprises implanting Ar into said remaining SOI layer.

7. The method according to claim 1, wherein said step of forming an isolation layer comprises:

curing said SOI substrate having said first and second trenches;

forming a conformal silicon nitride liner over said SOI substrate; and forming a CVD oxide layer on said silicon nitride liner to fill said first and second trenches.

8. The method according to claim 1, further including the steps of:

carrying out an ion implantation for forming an electrode for said SOI layer in said ground region by using an ion implantation mask after said step of forming an isolation layer;

carrying out a channel ion implantation to said SOI layer in said element region;

forming a gate electrode pattern including a gate electrode on said SOI layer in said element region; and carrying out an ion implantation for forming source/drain regions for said SOI layer in said element region by using said gate electrode pattern as an ion implantation mask.

9. The method according to claim 8, wherein said channel ion implantation and said ion implantation for forming source/drain regions are separately carried out for each of NMOS and PMOS transistor regions; and wherein said step of forming a gate electrode pattern is concurrently carried out for said NMOS and PMOS transistor regions.

10. The method according to claim 9, wherein said step of carrying out an ion implantation for forming an electrode for said SOI layer in said ground region is carried out together with said ion implantation for said PMOS transistor region in said step of carrying out an ion implantation for forming source/drain regions for said SOI layer in said element region.

* * * * *